United States Patent
Akash et al.

(10) Patent No.: US 12,227,202 B2
(45) Date of Patent: Feb. 18, 2025

(54) ADAPTIVE TRUST CALIBRATION

(71) Applicant: Honda Motor Co., Ltd., Tokyo (JP)

(72) Inventors: Kumar Akash, Milpitas, CA (US);
Teruhisa Misu, Mountain View, CA (US)

(73) Assignee: Honda Motor Co., Ltd., Tokyo (JP)

( * ) Notice: Subject to any disclaimer, the term of this patent is extended or adjusted under 35 U.S.C. 154(b) by 313 days.

(21) Appl. No.: 17/344,119

(22) Filed: Jun. 10, 2021

(65) Prior Publication Data

US 2022/0396287 A1     Dec. 15, 2022

(51) Int. Cl.
*B60W 60/00*     (2020.01)
*B60W 40/09*     (2012.01)

(52) U.S. Cl.
CPC .......... *B60W 60/001* (2020.02); *B60W 40/09* (2013.01); *B60W 2540/221* (2020.02); *B60W 2540/225* (2020.02); *B60W 2540/229* (2020.02)

(58) Field of Classification Search
CPC .............. B60W 60/001; B60W 40/09; B60W 2540/225; B60W 2540/229; B60W 2540/221
See application file for complete search history.

(56) References Cited

U.S. PATENT DOCUMENTS

| 5,677,997 | A | 10/1997 | Talatik |
| 7,027,808 | B2 | 4/2006 | Wesby |
| 8,185,220 | B2 | 5/2012 | Lloyd |
| 8,984,423 | B2 | 3/2015 | Mann et al. |
| 9,031,824 | B2 | 5/2015 | Nasle |
| 9,529,355 | B2 | 12/2016 | Reid et al. |
| 9,849,879 | B2 | 12/2017 | Kelly et al. |
| 9,855,956 | B2 * | 1/2018 | Omi ........................ G08B 25/08 |
| 9,969,392 | B2 | 5/2018 | Fairgrieve et al. |
| 10,372,130 | B1 * | 8/2019 | Kaushansky .......... B60K 35/26 |
| 10,875,545 | B2 * | 12/2020 | Iwamoto ................ B60W 40/09 |
| 2006/0082545 | A1 | 4/2006 | Choquet et al. |
| 2019/0202468 | A1 * | 7/2019 | Kaji ....................... B60W 40/08 |

(Continued)

FOREIGN PATENT DOCUMENTS

JP     2008117140 A   *   5/2008
JP     2016066279 A   *   4/2016

OTHER PUBLICATIONS

"White, Samuel; Techniques for Modeling Drivers' Trust in an Automated Vehicle; Aug. 2019; ProQuest LLC" (Year: 2019).*

(Continued)

*Primary Examiner* — Elaine Gort
*Assistant Examiner* — Christopher R Cardimino
(74) *Attorney, Agent, or Firm* — Rankin, Hill & Clark LLP (57) ABSTRACT

Aspects of adaptive trust calibration may include receiving a trust model for an occupant of an autonomous vehicle calculated based on occupant sensor data and a first scene context sensor data, and/or receiving a second scene context sensor data associated with an environment of the autonomous vehicle, determining an over trust scenario or an under trust scenario based on the trust model and a trust model threshold, and generating and implementing a human machine interface (HMI) action or a driving automation action based on the determination of the over trust scenario or the determination of the under trust scenario, and/or the second scene context sensor data.

16 Claims, 6 Drawing Sheets

(56) References Cited

U.S. PATENT DOCUMENTS

2020/0057487 A1* 2/2020 Sicconi ................... G06T 7/254
2022/0281461 A1* 9/2022 Gentner ................ B60W 40/08
2022/0388543 A1* 12/2022 David ............... B60W 60/0051

OTHER PUBLICATIONS

"Akash, Kumar; Reimagining Human-Machine Interactions Through Trust-Based Feedback; Aug. 2020; Purdue University" (Year: 2020).*
"Tenhundfeld, N. L., et al; Calibrating Trust in Automation Through Familiarity With the Autoparking Feature of a Tesla Model X; Aug. 6, 2019; Journal of Cognitive Engineering and Decision Making, 13(4), 279-294." (Year: 2019).*

\* cited by examiner

ADAPTIVE TRUST CALIBRATION

BACKGROUND

Individuals are increasingly becoming dependent on automated systems in vehicles ranging from advanced driver-assistance systems (ADAS) like adaptive cruise control and collision avoidance to self-driving automation. Even with significant growth in technological capabilities, human supervision and intervention are still required. Researchers have shown that human trust plays a critical role in these interactions between human and automated systems. On one hand, low levels of trust may lead to disuse of automation and therefore losing the benefits of the automation. On the other hand, over-trust may lead to a human disengaging fully from the driving process.

Trust calibration is necessary for successful interaction between humans and automation. Human trust plays a fundamental role in their interactions with automated systems. However, human trust is an abstract, multidisciplinary concept, with individual disciplines characterizing a different relationship as "trust". To avoid trust miscalibration (i.e., over trust or under trust), there is a need to design human-aware systems that may predict human trust and adapt its behavior accordingly.

For example, during an interaction between a human and a driving automation system, the human expects and trusts the automated system to drive safely in an uncertain and risky environment. Quantifying and predicting trust is a challenging task given that its meaning changes across contexts as well as between different humans. In particular, trust miscalibration, caused by under trust or over trust, leads to disuse of automation. Therefore, the present challenge is to design human-aware automation that may adapt its behavior to avoid trust miscalibration.

BRIEF DESCRIPTION

According to one aspect, a computer-implemented method for adaptive trust calibration may include receiving occupant sensor data associated with an occupant of an autonomous vehicle, receiving scene context sensor data associated with an environment of the autonomous vehicle, generating a trust model for the occupant based on the occupant sensor data and the scene context sensor data, determining an over trust scenario or an under trust scenario based on the trust model and a trust model threshold, and generating and implementing a human machine interface (HMI) action or a driving automation action based on the determination of the over trust scenario or the determination of the under trust scenario.

The occupant sensor data may include one or more of occupant gaze data or occupant physiological data. The scene context sensor data may include one or more of operational signals for the autonomous vehicle. The HMI action may include one or more of displaying a display cue, providing an audio cue, or providing a haptic cue associated with a road element within the environment. The HMI action may include one or more of an action to enable, disable, or adjust a vehicle system. The vehicle system may include one or more of an air conditioning (A/C) system, a fan system, a seat system, or an augmented reality system. The driving automation action may include one or more of adjusting acceleration or deceleration, aggressiveness (e.g., in terms of cornering, acceleration based on a scenario or features of the environment), timing or distance to object or position for applying brakes, minimum distance boundary to a road element, or a stopping distance from a point or line in the environment. The environment may be a simulated environment and the autonomous vehicle may be simulated within the simulated environment. The generating and the implementing the HMI action or the driving automation action may be based on receiving a second scene context sensor data. The autonomous vehicle may be autonomously operating or driving through the environment.

According to one aspect, a computer-implemented method for adaptive trust calibration may include receiving a trust model for an occupant of an autonomous vehicle calculated based on occupant sensor data and a first scene context sensor data, receiving a second scene context sensor data associated with an environment of the autonomous vehicle, determining an over trust scenario or an under trust scenario based on the trust model and a trust model threshold, and generating and implementing a human machine interface (HMI) action or a driving automation action based on the determination of the over trust scenario or the determination of the under trust scenario and the second scene context sensor data.

The occupant sensor data may include one or more of occupant gaze data or occupant physiological data. The scene context sensor data may include one or more of operational signals for the autonomous vehicle. The HMI action may include one or more of displaying a display cue, providing an audio cue, or providing a haptic cue associated with a road element within the environment.

According to one aspect, a system for adaptive trust calibration may include a behavior controller and one or more of a human machine interface (HMI) controller or a driving automation controller. The behavior controller may receive a trust model for an occupant of an autonomous vehicle calculated based on occupant sensor data and a first scene context sensor data, receive a second scene context sensor data associated with an environment of the autonomous vehicle, and determine an over trust scenario or an under trust scenario based on the trust model and a trust model threshold. The HMI controller may generate and implement an HMI action based on the determination of the over trust scenario or the determination of the under trust scenario and the second scene context sensor data. The driving automation controller may generate and implement a driving automation action based on the determination of the over trust scenario or the determination of the under trust scenario and the second scene context sensor data.

The occupant sensor data may include one or more of occupant gaze data or occupant physiological data. The scene context sensor data may include one or more of operational signals for the autonomous vehicle. The HMI action may include one or more of displaying a display cue, providing an audio cue, or providing a haptic cue associated with a road element within the environment. The driving automation action may include one or more of adjusting acceleration or deceleration, minimum distance boundary to a road element, or a stopping distance from a point or line in the environment. The environment may be a simulated environment and the autonomous vehicle may be simulated within the simulated environment.

DETAILED DESCRIPTION

The following includes definitions of selected terms employed herein. The definitions include various examples and/or forms of components that fall within the scope of a term and that may be used for implementation. The examples are not intended to be limiting. Further, one having ordinary skill in the art will appreciate that the components discussed herein, may be combined, omitted or organized with other components or organized into different architectures.

A "processor", as used herein, processes signals and performs general computing and arithmetic functions. Signals processed by the processor may include digital signals, data signals, computer instructions, processor instructions, messages, a bit, a bit stream, or other means that may be received, transmitted, and/or detected. Generally, the processor may be a variety of various processors including multiple single and multicore processors and co-processors and other multiple single and multicore processor and co-processor architectures. The processor may include various modules to execute various functions.

A "memory", as used herein, may include volatile memory and/or non-volatile memory. Non-volatile memory may include, for example, ROM (read only memory), PROM (programmable read only memory), EPROM (erasable PROM), and EEPROM (electrically erasable PROM). Volatile memory may include, for example, RAM (random access memory), synchronous RAM (SRAM), dynamic RAM (DRAM), synchronous DRAM (SDRAM), double data rate SDRAM (DDRSDRAM), and direct RAM bus RAM (DRRAM). The memory may store an operating system that controls or allocates resources of a computing device.

A "disk" or "drive", as used herein, may be a magnetic disk drive, a solid state disk drive, a floppy disk drive, a tape drive, a Zip drive, a flash memory card, and/or a memory stick. Furthermore, the disk may be a CD-ROM (compact disk ROM), a CD recordable drive (CD-R drive), a CD rewritable drive (CD-RW drive), and/or a digital video ROM drive (DVD-ROM). The disk may store an operating system that controls or allocates resources of a computing device.

A "bus", as used herein, refers to an interconnected architecture that is operably connected to other computer components inside a computer or between computers. The bus may transfer data between the computer components. The bus may be a memory bus, a memory controller, a peripheral bus, an external bus, a crossbar switch, and/or a local bus, among others. The bus may also be a vehicle bus that interconnects components inside a vehicle using protocols such as Media Oriented Systems Transport (MOST), Controller Area network (CAN), Local Interconnect Network (LIN), among others.

A "database", as used herein, may refer to a table, a set of tables, and a set of data stores (e.g., disks) and/or methods for accessing and/or manipulating those data stores.

An "operable connection", or a connection by which entities are "operably connected", is one in which signals, physical communications, and/or logical communications may be sent and/or received. An operable connection may include a wireless interface, a physical interface, a data interface, and/or an electrical interface.

A "computer communication", as used herein, refers to a communication between two or more computing devices (e.g., computer, personal digital assistant, cellular telephone, network device) and may be, for example, a network transfer, a file transfer, an applet transfer, an email, a hypertext transfer protocol (HTTP) transfer, and so on. A computer communication may occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, among others.

A "vehicle", as used herein, refers to any moving vehicle that is capable of carrying one or more human occupants and is powered by any form of energy. The term "vehicle" includes cars, trucks, vans, minivans, SUVs, motorcycles, scooters, boats, personal watercraft, and aircraft. In some scenarios, a motor vehicle includes one or more engines. Further, the term "vehicle" may refer to an electric vehicle (EV) that is powered entirely or partially by one or more electric motors powered by an electric battery. The EV may include battery electric vehicles (BEV) and plug-in hybrid electric vehicles (PHEV). Additionally, the term "vehicle" may refer to an autonomous vehicle and/or self-driving vehicle powered by any form of energy. The autonomous vehicle may or may not carry one or more human occupants.

A "vehicle system", as used herein, may be any automatic or manual systems that may be used to enhance the vehicle, driving, and/or safety. Exemplary vehicle systems include an autonomous driving system, an electronic stability control system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), a climate control system, an electronic pre-tensioning system, a monitoring system, a passenger detection system, a vehicle suspension system, a vehicle seat configuration system, a vehicle cabin lighting system, an audio system, a sensory system, among others.

The aspects discussed herein may be described and implemented in the context of non-transitory computer-readable storage medium storing computer-executable instructions. Non-transitory computer-readable storage media include computer storage media and communication media. For example, flash memory drives, digital versatile discs (DVDs), compact discs (CDs), floppy disks, and tape cassettes. Non-transitory computer-readable storage media may include volatile and non-volatile, removable and non-removable media implemented in any method or technology for storage of information such as computer readable instructions, data structures, modules, or other data.

Figure 1:
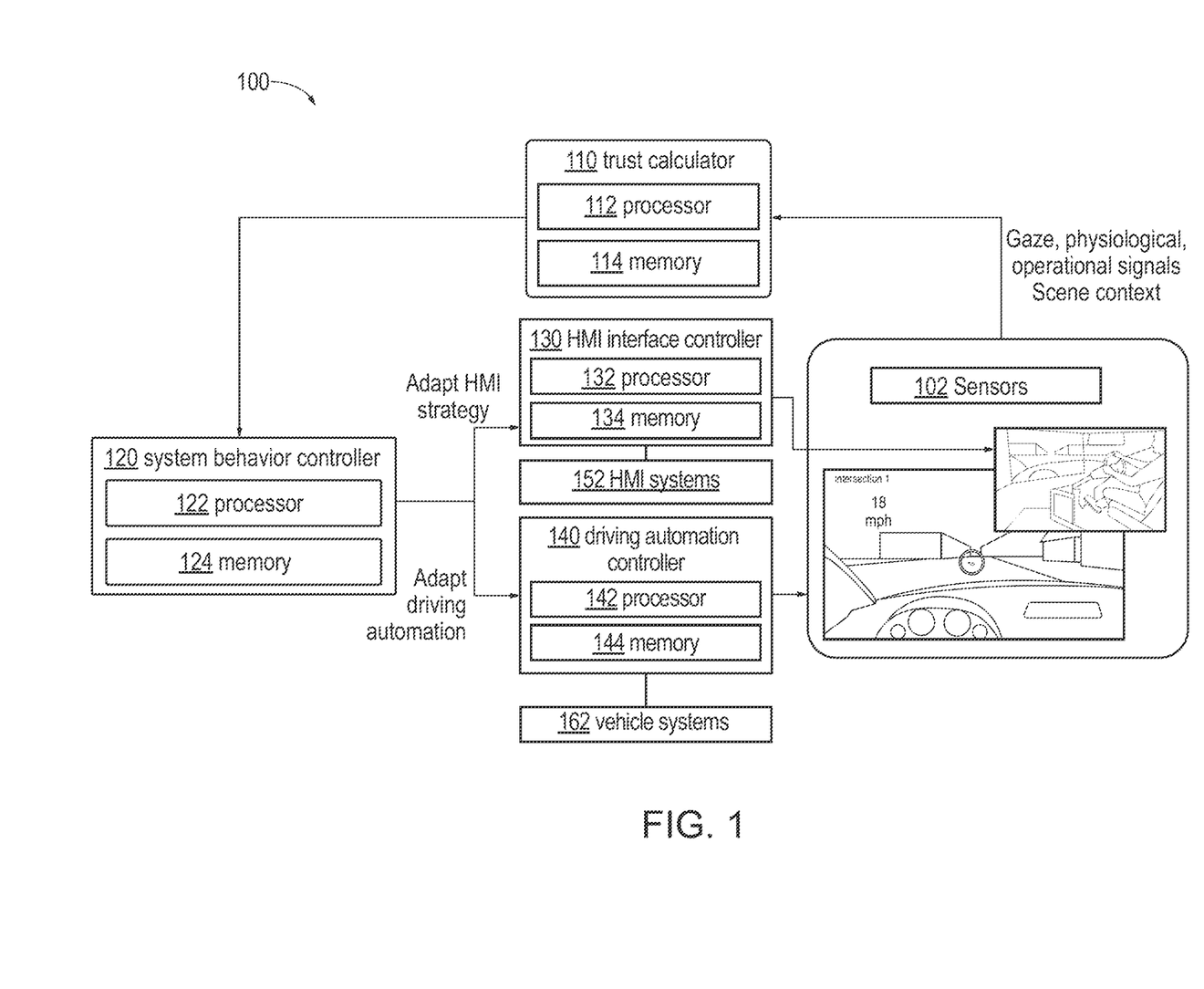
FIG. 1 is an exemplary component diagram of a system for adaptive trust calibration, according to one aspect.

FIG. 1 is an exemplary component diagram of a system 100 for adaptive trust calibration, according to one aspect.

The system 100 for adaptive trust calibration may include one or more sensors 102, a trust model calculator 110, a behavior controller 120, an HMI interface controller 130, a driving automation controller 140, an HMI system 152, and one or more vehicle systems 162.

The trust model calculator 110 may include and/or be implemented via a processor 112 and a memory 114. The behavior controller 120 may include and/or be implemented via a processor 122 and a memory 124. The HMI interface controller 130 may include and/or be implemented via a processor 132 and a memory 134. The driving automation controller 140 may include and/or be implemented via a processor 142 and a memory 144. One or more of the processors 112, 122, 132, 142 and memories 114, 124, 134, 144 of the respective trust model calculator 110, the behavior controller 120, the HMI interface controller 130, the driving automation controller 140, or the HMI interface may be implemented as the same (i.e., a single) processor and memory, according to one aspect. According to another aspect, the processors 112, 122, 132, 142 and memories 114, 124, 134, 144 may be implemented separately and the trust model calculator 110, the behavior controller 120, the HMI interface controller 130, the driving automation controller 140 may be implemented as separate components.

One or more of the trust model calculator 110, the behavior controller 120, the HMI interface controller 130, the driving automation controller 140, or the HMI interface may be implemented with a disk drive or a storage drive and/or be connected via a bus such that respective components are operably connected and be capable of computer communication.

The trust model calculator 110 may include a trust model database utilized for calculating trust scores. The trust model calculator 110 may be modeled based on a deep neural network, a convolutional neural network (CNN), or a recurrent neural network (RNN). The system considers that human trust dynamics have two time scales: a fast varying short-term trust that captures the effect of instantaneous situation (similar to situational trust) and a relatively slow varying long-term trust that captures the effect of a human's experience during an interaction (similar to learned trust).

The trust model calculator 110 may receive occupant sensor data associated with an occupant of an autonomous vehicle, receive a first scene context sensor data associated with an environment of the autonomous vehicle at a first time, a second scene context sensor data associated with the environment of the autonomous vehicle at a second time, and generate a trust model for the occupant based on the occupant sensor data and the scene context sensor data.

The autonomous vehicle may autonomously operate or drive through the environment. Within a semi-autonomous operating mode for the vehicle, steering, acceleration, and braking may be autonomously controlled by the driving automation controller 140 of the autonomous vehicle (herein 'vehicle'). However, the driver may still be responsible to manually drive the vehicle such that the driver may have to supervise and takeover control of the steering, acceleration, and/or braking of the vehicle in one or more circumstances as deemed by the driver. Accordingly, the semi-autonomous operating mode may reduce the driver's workload along with improving driving safety. An adaptive trust application executed by the behavior controller 120 may utilize computer-executed processes to thereby ensure that benefits of such operation of the vehicle are enhanced by maximizing the driver's trust in the semi-autonomous control of the vehicle.

The occupant sensor data may include one or more of occupant gaze data or occupant physiological data received from the sensors 102. The scene context sensor data may include one or more operational signals (e.g., signals which may be received from sensors 102 of the vehicle, or received from the vehicle CAN, such as velocity, acceleration, steering angle, etc.) for the autonomous vehicle. In any event, the occupant sensor data and the scene context sensor data may be received from sensors 102 on the autonomous vehicle. Examples of sensors 102 include an eye gaze sensor, LiDAR sensors, radar sensors, image capture sensors, a camera system including cameras, a global positioning system (GPS), a laser projection system, etc.

According to one aspect, the laser projection system may include one or more LiDAR transceivers. The one or more LiDAR transceivers of the laser projection system may be disposed at respective external front, rear, and/or side portions of the vehicle including but not limited to different portions of bumpers, body panels, fenders, lighting units, windows, or the windshield. The one or more respective LiDAR transceivers may include one or more planar sweep lasers that may be configured to oscillate and emit one or more laser beams of ultraviolet, visible, or near infrared light toward the surrounding environment of the vehicle. The laser projection system may be configured to receive one or more reflected laser waves based on one or more laser beams emitted by the LiDAR transceivers. The one or more reflected laser waves may be reflected off of one or more objects (e.g., static and/or dynamic objects) that may be located within the surrounding environment of the vehicle.

In one configuration, the laser projection system may be configured to output LiDAR data associated to one or more reflected laser waves to the adaptive trust application executed by the behavior controller 120. The adaptive trust application may be configured to analyze the LiDAR data that pertains to the surrounding environment of the vehicle to determine the scene of the surrounding environment of the vehicle based on the location of one or more dynamic objects that may be located within the surrounding environment of the vehicle, one or more static objects that may be located within the surrounding environment of the vehicle, one or more roads/pathways (e.g., guardrails, curbs, barrier, etc.) that are located within the surrounding environment of the vehicle, one or more lanes that may be located upon one or more roads/pathways that are located within the surrounding environment of the vehicle, and the like. The adaptive trust application may determine a scene complexity (e.g., value, designation) that may be associated with the scene of the vehicle as determined based on LiDAR data provided by the laser projection system and/or the image data provided by the camera system.

The sensors 102 may include a camera system of the vehicle which may feed sensor data to the trust model calculator 110. The camera system may include one or more cameras positioned at one or more internal portions of an interior cabin of the vehicle to capture images of the driver (e.g., operator or occupant) of the vehicle. The camera system may also include one or more cameras that are positioned at one or more external portions of the vehicle to capture images of the surrounding environment of the vehicle (e.g., a predetermined area located around (e.g., front, rear, side) the vehicle.

Cameras that are positioned at one or more internal portions of an interior cabin of the vehicle may be configured to capture images of the driver's eyes to be analyzed, including the driver's eye movements within the vehicle. According to one aspect, the one or more cameras may be configured to capture images of the driver's eyes and send respective image data to the adaptive trust application executed on the behavior controller 120 and to the trust model calculator 110. The adaptive trust application may be configured to analyze the image data associated with one or more images captured for a predetermined period of time to analyze one or more gaze cues to recognize the driver's eye gaze cues over a predetermined period of time.

According to one aspect, the adaptive trust application may continuously analyze the gaze cues to recognize the driver's eye gaze directions. Specifically, the adaptive trust application may detect the location of the driver's eyes from the image(s) sent by the camera system and may specifically evaluate specific areas of the eyes (e.g., iris, pupil, corners of the eye, etc.). The adaptive trust application may utilize virtually any method to perform gaze detection and translate the gaze cues to determine the driver's eye gaze directions. According to one aspect, the adaptive trust application may analyze the eye gaze directions of the driver based off of a linear model that may take into account the evaluation of the specific areas of the eyes of the driver of the vehicle.

The trust model calculator 110 may determine an over trust or under trust scenario based on the information from the detected location of the driver's eyes from the image(s) sent by the camera system. For example, if a driver looks away from the roadway or environment for greater than a threshold amount of time, the trust model calculator 110 may determine the over trust scenario. As another example, if the driver looks away from the roadway or environment for greater than a threshold amount of time and the vehicle is driving in an environment which is not merely a straight roadway (e.g., not a highway scenario), the trust model calculator 110 may determine the over trust scenario. Conversely, if the driver is continuously looking at an upcoming obstacle within the roadway or environment for greater than a threshold amount of time, the trust model calculator 110 may determine the under trust scenario.

With respect to the one or more cameras of the camera system that are positioned at the external surrounding environment of the vehicle, the one or more cameras may be disposed at one or more external front portions of the vehicle, similarly to the LiDAR sensors. The one or more cameras of the camera system may be disposed at external front portions of the vehicle, including, but not limited to different portions of the vehicle dashboard, vehicle bumper, vehicle front lighting units, vehicle fenders, and the windshield. According to one aspect, the one or more cameras may be configured as RGB cameras which capture RGB bands that are configured to capture rich information about object appearance, as well as relationships and interactions between the vehicle and objects within the surrounding environment of the vehicle.

According to another aspect, the one or more cameras may be stereoscopic cameras that are configured to capture environmental information in the form three-dimensional images. In one or more configurations, the one or more cameras may be configured to capture one or more first person viewpoint RGB images/videos of the surrounding environment of the vehicle. The camera system may be configured to convert one or more RGB images/videos (e.g., sequences of images) into image data that is communicated to the adaptive trust application to be analyzed.

According to one aspect, the adaptive trust application may be configured to analyze the image data that pertains to the surrounding environment of the vehicle and determine a scene of the surrounding environment of the vehicle. The scene of the surrounding environment may include one or more dynamic objects or obstacles (e.g., other vehicles, pedestrians) that may be located within the surrounding environment of the vehicle, one or more static objects or features of the environment (e.g., street signs, trees, buildings) that may be located within the surrounding environment of the vehicle, one or more roads/pathways that may be located within the surrounding environment of the vehicle (e.g., streets, intersections), one or more lanes that may be located upon one or more roads/pathways that may be located within the surrounding environment of the vehicle, and the like. As discussed below, the adaptive trust application may determine a scene complexity (e.g., value, designation) that may be associated with the scene of the vehicle as determined based on image data provided by the camera system and/or data provided by a laser projection system of the vehicle.

Trust dynamics or the trust model may be determined based on the driver's reliance on the semi-autonomous or autonomous operation of the vehicle, as calculated by the trust model calculator 110 based on data received from the sensors 102. Additionally, a real-time automation transparency may be provided to the driver, occupant, or operator of the vehicle in the form of augmented reality cues which may be analyzed with respect to determining trust dynamics. In addition, automation reliability that is associated with the semi-autonomous or autonomous operation of the vehicle and a scene complexity determined with respect to a scene of the surrounding environment of the vehicle may be analyzed with respect to determining trust dynamics or the trust model.

Additionally, workload dynamics for the trust model may be determined based on the eye gaze directions of the driver over a predetermined period of time. Automation transparency, automation reliability, and scene complexity may also be utilized to determine workload dynamics for the trust model. Accordingly, the adaptive trust application may capture a dynamic interaction between trust and workload behavior as it evolves over time (e.g., in real-time and as a predicted future point in time) and may be configured to process and implement an optimal control policy to appropriately vary automation transparency. According to one aspect, in addition to varying automation transparency, the adaptive trust application may be configured to alter the semi-autonomous or autonomous operation of one or more driving functions to achieve trust calibration.

The behavior controller 120 may receive the trust model for the occupant of the autonomous vehicle. The behavior controller 120 may determine an over trust scenario or an under trust scenario based on the trust model and a trust model threshold. When the under trust scenario is determined, the HMI controller may execute the adaptive trust calibration application to adjust, by increasing, a level of automation transparency for the user or occupant, thereby calibrating the human trust to be increased by offering additional clarity as to what the autonomous vehicle is 'thinking' and sharing the decision making process with the user. The behavior controller 120 may determine the over trust scenario or the under trust scenario based on the second scene context sensor data. In this way, the behavior controller 120 may utilize past over trust or past under trust scenarios to adapt or enhance trust calibration for future scenarios.

The behavior controller 120 may select a combination or merely one of a driving automation action or an HMI action based on the trust model and the scene context. According to one aspect, the behavior controller 120 may implement both the driving automation action and the HMI action when the trust score is lower than a scenario where the trust score is higher. In the higher trust score scenario, the behavior controller 120 may implement merely the HMI action via the HMI interface controller 130. According to another aspect, if the trust score is greater or even higher, the behavior controller 120 may implement merely the driving automation action via the driving automation controller 140. According to another aspect, the behavior controller 120 may implement additional driving automation actions or additional HMI actions if under trust scenarios repeatedly occur for a similar scene context. The behavior controller 120 may phase out additional driving automation actions or additional HMI actions for under trust scenarios to gradually acclimate a user or a driver to autonomous driving within different scene contexts.

The HMI interface controller 130 may execute one or more applications, operating systems, vehicle system and subsystem user interfaces, among others. The HMI interface controller 130 may execute an adaptive trust calibration application that adjusts a level of automation transparency that is provided in the form of one or more augmented reality cues provided to an individual or occupant of the vehicle during semi-autonomous or autonomous operation of the vehicle. The adaptive trust application may vary automation transparency and functionality with respect to one or more driving functions of the vehicle that may be based on human trust and workload estimates, and may utilize CNNs, RNNs, Markov models, etc.

The HMI interface controller 130 may generate and implement an HMI action via one or more of the HMI systems 152 based on the determination of the over trust scenario or the determination of the under trust scenario. HMI systems 152 may include a speaker, an audio device, a display, a head up display (HUD), a meter display, a dashboard display, an instrument cluster display, etc. The HMI interface controller 130 may generate and implement the HMI action based on the second scene context sensor data. The HMI action may include one or more of displaying a display cue, a display alert, providing an audio cue or audio alert, or providing a haptic cue associated with a road element within the environment. Additionally, the HMI action may include one or more of an action to enable, disable, or adjust one or more of the vehicle systems 162. The vehicle systems 162 may include one or more of an air conditioning (A/C) system, a fan system, a seat system, or an augmented reality system.

Examples of under trust may include taking over driving or autonomous operation when an object or obstacle is detected, even when the autonomous vehicle has already detected the object or obstacle and has planned on executing a corresponding driving automation action in response to the detected object or obstacle. Examples of physiological data received associated with under trust may include increased human workload (e.g., providing more driving inputs or additional eye gaze activity compared to a baseline), increased stress (e.g., increased heartbeat, elevated body temperature, etc.) during autonomous operation of the vehicle. Other examples of under trust may include failing to activate or utilize automated driving (AD) or advanced driver-assistance systems (ADAS) features in situations or scenarios which are within an AD/ADAS design domain (e.g., when the autonomous vehicle is travelling along a straight roadway with no traffic within a radius, etc.).

Examples of over trust may include disregarding the environment around the vehicle for greater than a threshold amount of time, such as when the user or occupant begins to read a book, interact with a mobile device, tend to work, or ignore warnings provided by the autonomous vehicle, for example. Other examples of over trust may include activating or utilizing the AD/ADAS features in situations or scenarios which are outside the AD/ADAS design domain (e.g., instruction manual of autonomous vehicle states it may not be desirable to activate AD/ADAS in an exemplary scenario, but the operator or driver engages the AD/ADAS features contrary to the warning). Similarly, another example of over trust may include failing to take manual control or a late take over during potential unreliable operation of the autonomous vehicle (e.g., after a takeover request or warning has been issued by the vehicle via the HMI system 152).

The driving automation action may include one or more of adjusting acceleration or deceleration, minimum distance boundary to a road element, or a stopping distance from a point or line in the environment. In this regard, the driving automation controller 140 may execute autonomous driving commands to operate the vehicle to autonomously control one or more driving functions of the vehicle. Additional examples of driving automation action may include, but may not be limited to steering, braking, accelerating, merging, turning, coasting, etc.

According to one aspect, the adaptive trust application may utilize data included within the trust database of the trust model calculator 110 to communicate with the driving automation controller 140 to control the level of automation transparency and/or an autonomous operation of one or more driving functions of the vehicle. In some scenarios, the adaptive trust application may be configured to communicate with the driving automation controller 140 to provide autonomous operation of one or more driving functions of the vehicle to account for one or more external factors that may include, but are not limited to, road/pathway conditions of a road/pathway on which the vehicle is traveling, a lane in which the vehicle is traveling, status of traffic signals, traffic patterns, traffic regulations, etc.

According to one aspect, the environment may be a simulated environment and the autonomous vehicle may be simulated within the simulated environment.

According to one aspect, the vehicle may additionally include a communication device (i.e., of vehicle system 162) that may be operably controlled by the system behavior controller 120. The communication device may include one or more transceivers of the vehicle. The communication device may be configured to communicate through the internet through one or more wireless communication signals that may include, but may not be limited to Bluetooth® signals, Wi-Fi signals, ZigBee signals, Wi-Max signals, and the like. The communication device may be configured to communicate through the internet to send and receive communication signals to and from an externally hosted server infrastructure or an external server. According to one aspect, the trust model calculator 110 may be hosted on the external server and may execute the adaptive trust application and/or the trust model calculator 110 to utilize processing power to determine an effect on human trust and workload with respect to automated driving of the vehicle to thereby process the control policy used to control autonomous transparency associated with the semi-autonomous or autonomous operation of at least one driving function of the vehicle.

Neural network may be utilized to model the effects of human trust and workload on observable variables using a Markov decision process model to thereby enable the application to analyze the human trust model and workload dynamics based on the effects modeled using the Markov decision process model. According to one aspect, the components of the external server including the neural network may be operably controlled by a processor. The processor may be configured to operably control the neural network to utilize machine learning/deep learning to provide artificial intelligence capabilities that may be utilized to build a machine learning dataset.

With continued reference to the aspect where the trust model calculator 110 is hosted on the external server, the processor may be operably connected to the memory. The memory may store one or more operating systems, applications, associated operating system data, application data, executable data, and the like. According to this aspect, the machine learning dataset may be configured as a dataset that includes one or more fields associated with data that may pertain to one or more determined levels of human trust and workload with respect to the automated driving of the vehicle that is based on one or more of the scene complexity, the automation reliability, and the automation transparency. In particular, the one or more fields may include a real-time determination of driver reliance, automation reliability, scene complexity, and automation transparency levels provided to the driver of the vehicle. Additionally, the one or more fields may include a prediction of driver reliance and driver workload that may be based on the real-time determination of driver reliance and driver workload.

According to one aspect, the processor of the external server may additionally be configured to communicate with a communication device. The communication device may be configured to communicate through the internet through one or more wireless communication signals that may include, but may not be limited to Bluetooth® signals, Wi-Fi signals, ZigBee signals, Wi-Max signals, and the like. According to one aspect, the communication device may be configured to connect to the internet to send and receive communication signals to and from the vehicle. In this way, the system 100 for adaptive trust calibration may calibrate human trust accordingly based on multiple aspects.

Figure 2:
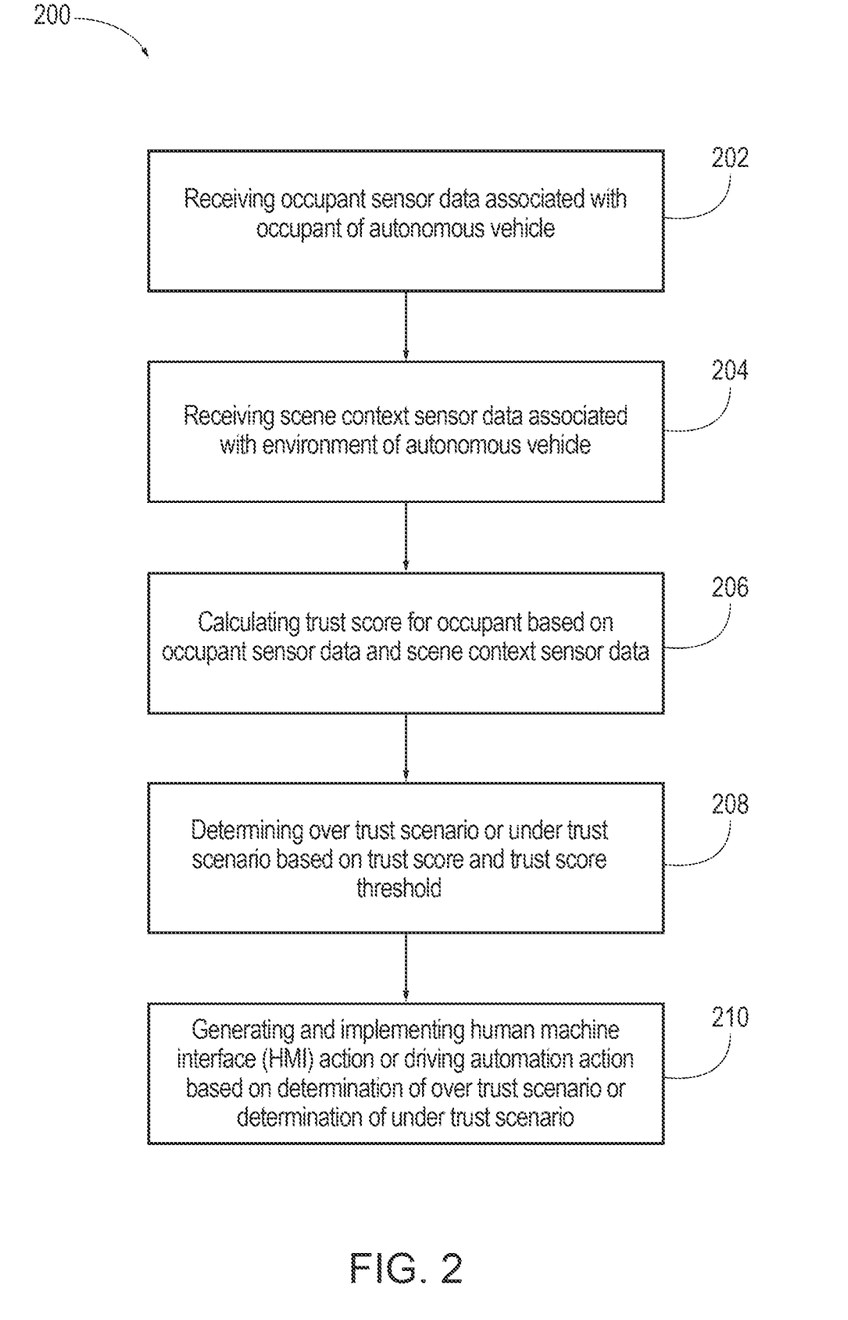
FIG. 2 is an exemplary flow diagram of a method for adaptive trust calibration, according to one aspect.

FIG. 2 is an exemplary flow diagram of a method for adaptive trust calibration, according to one aspect. The method 200 for adaptive trust calibration may include receiving 202 occupant sensor data associated with occupant of autonomous vehicle, receiving 204 scene context sensor data associated with environment of autonomous vehicle, generating 206 trust score or trust model for occupant based on occupant sensor data and scene context sensor data, determining 208 over trust scenario or under trust scenario based on trust score and trust score threshold, and generating and implementing 210 an HMI action or driving automation action based on determination of over trust scenario or determination of under trust scenario. According to one aspect, the method 200 for adaptive trust calibration may include receiving a second scene context sensor data associated with an environment of the autonomous vehicle and the generating and implementing 210 the HMI action or the driving automation action may be based on the second scene context sensor data.

The HMI interface controller 130 may generate and implement an HMI action via one or more of the HMI systems 152 based on past over trust or past under trust scenarios and current occupant sensor data or current scene context sensor data. For example, with reference to the scenario 300 of FIG. 3, if the occupant has historically taken control when the autonomous vehicle is entering a construction zone, but the system notes that this take over control has occurred despite the autonomous vehicle identifying or detecting the construction zone and determining a corresponding driving automation action for the identified or detected construction zone, when a subsequent construction zone 310 is identified, the HMI interface controller 130 may provide a notification or alert (e.g., via a display or audio system using any one of the HMI systems 152), indicating to the occupant that the autonomous vehicle is 'aware' of the impending construction zone 310 based on previous experience with other construction zones or abnormal road contours.

Figure 3:
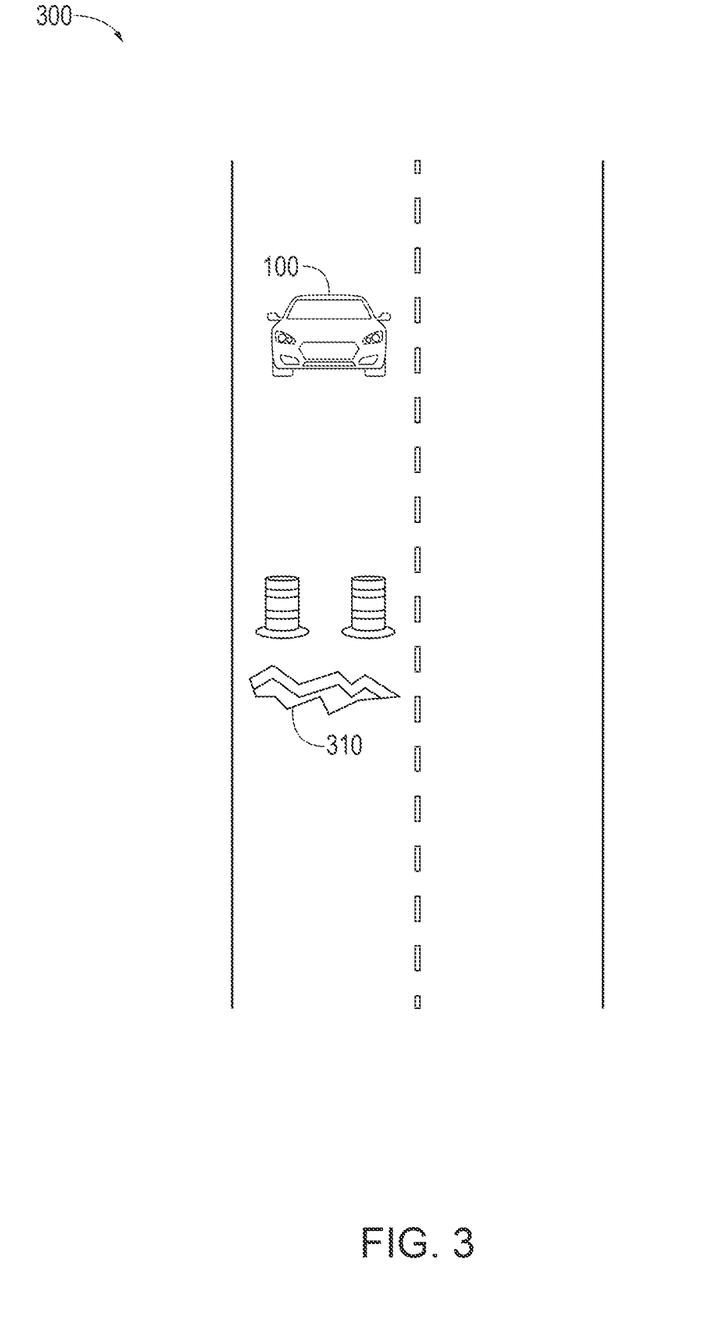
FIG. 3 is an exemplary scenario where the system for adaptive trust calibration of FIG. 1 may be implemented, according to one aspect.

According to this example, the trust model calculator 110 may have previously calculated a trust score associated with a scene context of the construction zone. The trust score, based on the previous or first occurrence of the take over control within the construction zone, may be below a trust score threshold. The sensors 102 may detect that the vehicle is entering or approaching another construction zone (e.g., second occurrence) and forward this as current scene context data to the trust model calculator 110. Based on the current scene context data including a scenario where the vehicle is approaching the construction zone and based on the trust score associated with the scene context of the construction zone from the prior interaction with the construction zone, the trust model calculator 110 may indicate to the behavior controller 120 that the driver trust is low, thereby indicating an under trust scenario.

In this regard, the behavior controller 120 may alert the HMI interface controller 130 to increase the level of transparency to the driver, thereby resulting in the HMI interface controller 130 activating the HMI system 152 to provide an AR-HUD notification outlining the impending construction zone and alerting the driver or occupant that the vehicle is aware of the construction zone.

Similarly, the driving automation controller 140 may generate and implement a driving automation action based on the determination of the over trust scenario or the determination of the under trust scenario. With respect to FIG. 3, the driving automation controller 140 may generate and implement a driving automation action of an evasive maneuver at a greater distance from the construction zone than a default distance for other objects or obstacles. Additionally, the driving automation controller 140 may generate and implement a driving automation action of a more gradual braking at a greater distance from the construction zone than a default braking distance for other objects or obstacles.

Figure 4:
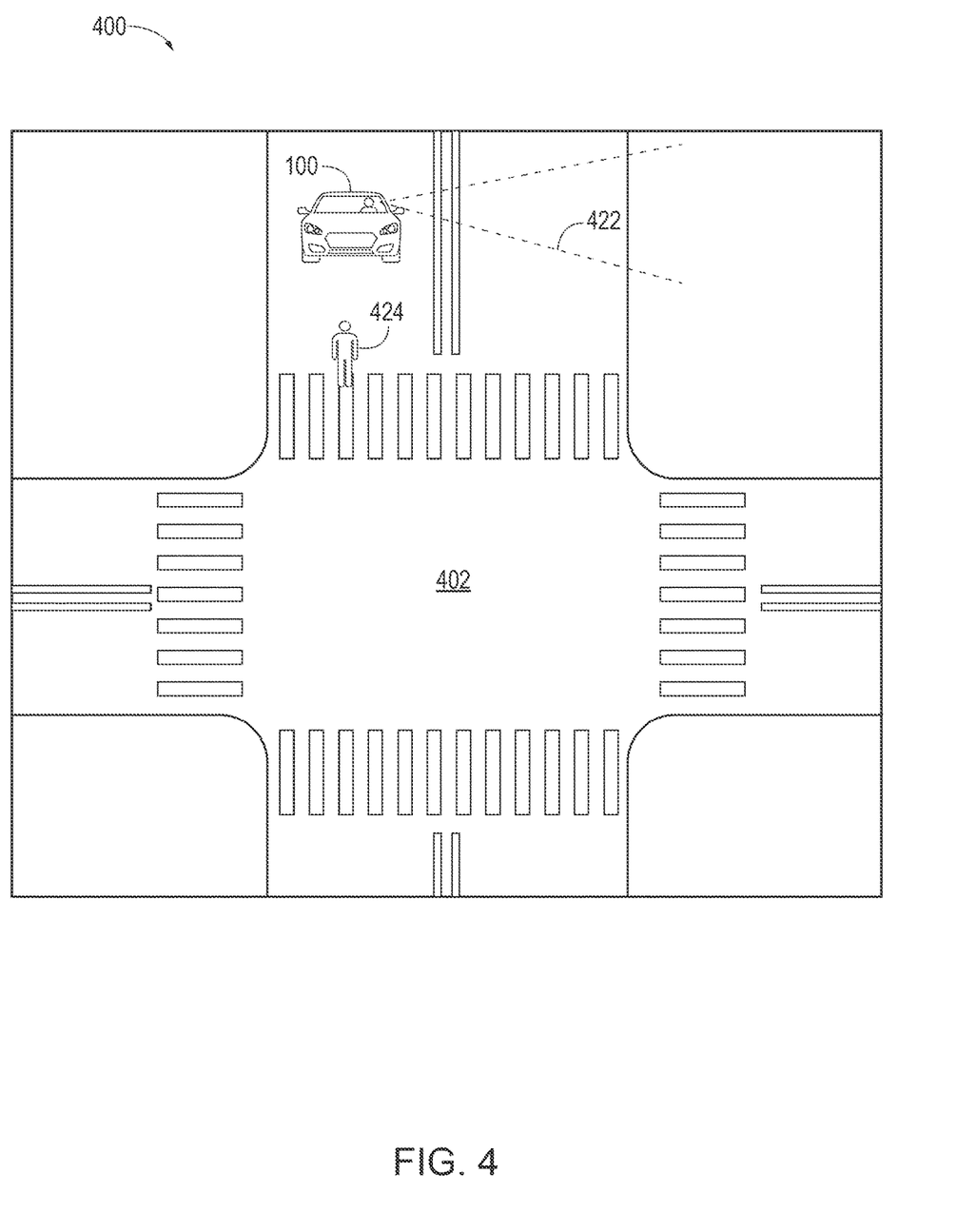
FIG. 4 is an exemplary scenario where the system for adaptive trust calibration of FIG. 1 may be implemented, according to one aspect.

As another example, with reference to the scenario 400 of FIG. 4, if the occupant has historically taken control, by braking, when the autonomous vehicle is entering an intersection with pedestrians, but the system notes that this take over control has occurred despite the autonomous vehicle identifying or detecting the intersection and pedestrians and determining a corresponding driving automation action for the identified or detected intersection, when a subsequent intersection 402 is identified, the autonomous vehicle may have the driving automation controller 140 apply brakes at a greater distance to the intersection or pedestrian 424 to indicate to the occupant that the autonomous vehicle is 'aware' of the pedestrian 424 and/or intersection 402. Further, the driving automation controller 140 may generate and implement a driving automation action based on an eye gaze direction 422 of the driver. For example, if the eye gaze direction 422 is away from the pedestrian 424, the driving automation controller 140 may apply the brakes sooner than if the eye gaze direction is directed to the pedestrian 424.

Figure 5:
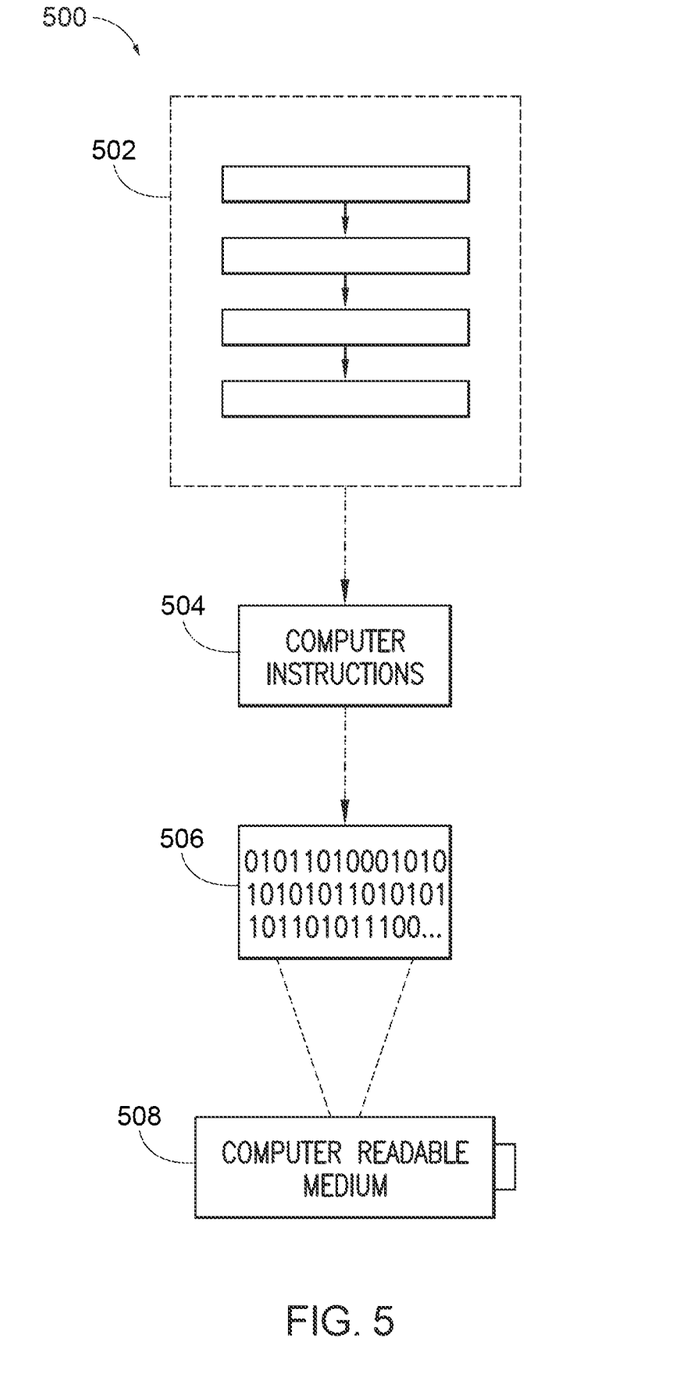
FIG. 5 is an illustration of an example computer-readable medium or computer-readable device including processor-executable instructions configured to embody one or more of the provisions set forth herein, according to one aspect.

Still another aspect involves a computer-readable medium including processor-executable instructions configured to implement one aspect of the techniques presented herein. An aspect of a computer-readable medium or a computer-readable device devised in these ways is illustrated in FIG. 5, wherein an implementation 500 includes a computer-readable medium 508, such as a CD-R, DVD-R, flash drive, a platter of a hard disk drive, etc., on which is encoded computer-readable data 506. This encoded computer-readable data 506, such as binary data including a plurality of zero's and one's as shown in 506, in turn includes a set of processor-executable computer instructions 504 configured to operate according to one or more of the principles set forth herein. In this implementation 500, the processor-executable computer instructions 504 may be configured to perform a method 502, such as the method 200 of FIG. 2. In another aspect, the processor-executable computer instructions 504 may be configured to implement a system, such as the system 100 of FIG. 1. Many such computer-readable media may be devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processing unit, an object, an executable, a thread of execution, a program, or a computer. By way of illustration, both an application running on a controller and the controller may be a component. One or more components residing within a process or thread of execution and a component may be localized on one computer or distributed between two or more computers.

Further, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 6:
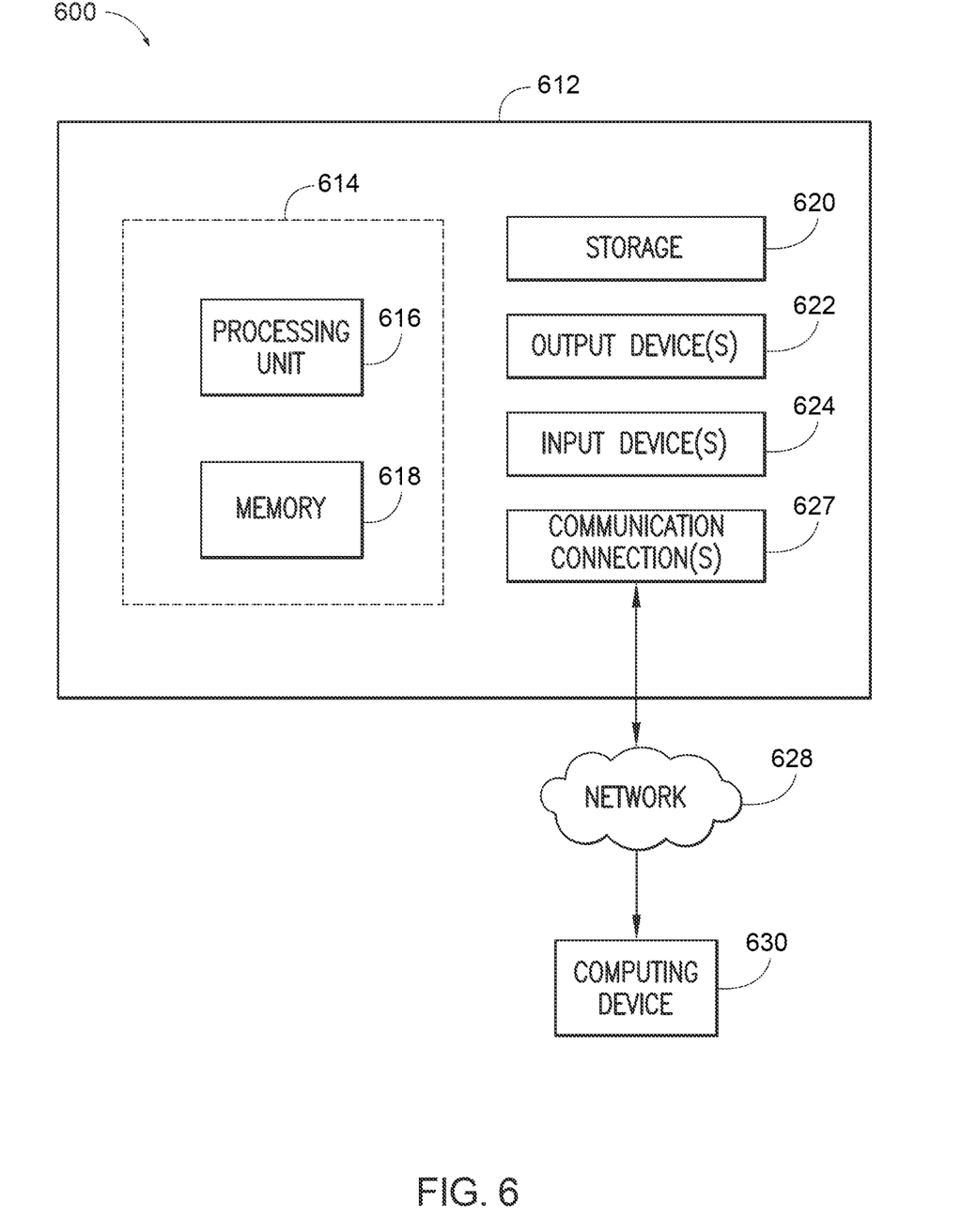
FIG. 6 is an illustration of an example computing environment where one or more of the provisions set forth herein are implemented, according to one aspect.

FIG. 6 and the following discussion provide a description of a suitable computing environment to implement aspects of one or more of the provisions set forth herein. The operating environment of FIG. 6 is merely one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, etc.

Generally, aspects are described in the general context of "computer readable instructions" being executed by one or more computing devices. Computer readable instructions may be distributed via computer readable media as will be discussed below. Computer readable instructions may be implemented as program modules, such as functions, objects, Application Programming Interfaces (APIs), data structures, and the like, that perform one or more tasks or implement one or more abstract data types. Typically, the functionality of the computer readable instructions are combined or distributed as desired in various environments.

FIG. 6 illustrates a system 600 including a computing device 612 configured to implement one aspect provided herein. In one configuration, the computing device 612 includes at least one processing unit 616 and memory 618. Depending on the exact configuration and type of computing device, memory 618 may be volatile, such as RAM, non-volatile, such as ROM, flash memory, etc., or a combination of the two. This configuration is illustrated in FIG. 6 by dashed line 614.

In other aspects, the computing device 612 includes additional features or functionality. For example, the computing device 612 may include additional storage such as removable storage or non-removable storage, including, but not limited to, magnetic storage, optical storage, etc. Such additional storage is illustrated in FIG. 6 by storage 620. In one aspect, computer readable instructions to implement one aspect provided herein are in storage 620. Storage 620 may store other computer readable instructions to implement an operating system, an application program, etc. Computer readable instructions may be loaded in memory 618 for execution by processing unit 616, for example.

The term "computer readable media" as used herein includes computer storage media. Computer storage media includes volatile and nonvolatile, removable and non-removable media implemented in any method or technology for storage of information such as computer readable instructions or other data. Memory 618 and storage 620 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which may be used to store the desired information and which may be accessed by the computing device 612. Any such computer storage media is part of the computing device 612.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

The computing device 612 includes input device(s) 624 such as keyboard, mouse, pen, voice input device, touch input device, infrared cameras, video input devices, or any other input device. Output device(s) 622 such as one or more displays, speakers, printers, or any other output device may be included with the computing device 612. Input device(s) 624 and output device(s) 622 may be connected to the computing device 612 via a wired connection, wireless connection, or any combination thereof. In one aspect, an input device or an output device from another computing device may be used as input device(s) 624 or output device(s) 622 for the computing device 612. The computing device 612 may include communication connection(s) 626 to facilitate communications with one or more other devices 630, such as through network 628, for example.

Although the subject matter has been described in language specific to structural features or methodological acts, it is to be understood that the subject matter of the appended claims is not necessarily limited to the specific features or acts described above. Rather, the specific features and acts described above are disclosed as example aspects.

Various operations of aspects are provided herein. The order in which one or more or all of the operations are described should not be construed as to imply that these operations are necessarily order dependent. Alternative ordering will be appreciated based on this description. Further, not all operations may necessarily be present in each aspect provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various of the above-disclosed and other features and functions, or alternatives or varieties thereof, may be desirably combined into many other different systems or applications. Also, that various presently unforeseen or unanticipated alternatives, modifications, variations or improvements therein may be subsequently made by those skilled in the art which are also intended to be encompassed by the following claims.

The invention claimed is:

1. A computer-implemented method for adaptive trust calibration for an autonomous vehicle semi-autonomously or autonomously operating or driving through an environment, comprising:
receiving occupant sensor data associated with an occupant of the autonomous vehicle from one or more sensors the autonomous vehicle;
receiving scene context sensor data associated with an environment of the autonomous vehicle at a first time from the sensors, including a scene complexity associated with a scene of the autonomous vehicle;
generating a trust model for the occupant based on the occupant sensor data and the scene context sensor data, including:
analyzing a real-time automation transparency to the occupant based on one or more cues provided to the occupant,
analyzing the scene complexity, and
determining workload dynamics of the occupant, based in part on a relationship between the occupant sensor data, the automation transparency and the scene complexity, to capture a dynamic interaction between occupant trust and occupant workload behavior over time;
receiving second scene context sensor data associated with an environment of the autonomous vehicle at a second time including receiving past over trust scenarios and determining whether the scene context sensor data is the same as one of the past over trust scenarios and updating the trust model based on the same past over trust scenario as current scene context data;
determining an over trust scenario based on the trust model and a trust model threshold; and
generating and implementing a human machine interface (HMI) action or a driving automation action based on the determination of the over trust scenario and e second scene context sensor data,
wherein the HMI action includes one or more of an action to enable, disable, or adjust a vehicle system including one or more of an air conditioning (A/C) system, a fan system, and a seat system.

2. The computer-implemented method for adaptive trust calibration of claim 1, wherein the occupant sensor data includes one or more of occupant gaze data or occupant physiological data.

3. The computer-implemented method for adaptive trust calibration of claim 1, wherein the scene context sensor data includes one or more of operational signals for the autonomous vehicle.

4. The computer-implemented method for adaptive trust calibration of claim 1, wherein the HMI action includes one or more of displaying a display cue, providing an audio cue, or providing a haptic cue associated with a road element within the environment.

5. The computer-implemented method for adaptive trust calibration of claim 1, wherein the driving automation action includes one or more of adjusting acceleration or deceleration, minimum distance boundary to a road element, or a stopping distance from a point or line in the environment.

6. The computer-implemented method for adaptive trust calibration of claim 1, wherein the environment is a simulated environment and wherein the autonomous vehicle is simulated within the simulated environment.

7. The computer-implemented method for adaptive trust calibration of claim 1, wherein the vehicle system further includes an augmented reality system.

8. A computer-implemented method for adaptive trust calibration for an autonomous vehicle semi-autonomously or autonomously operating or driving through an environment, comprising:
receiving a trust model for an occupant of the autonomous vehicle calculated based on occupant sensor data and first scene context sensor data including a scene complexity associated with a scene of the autonomous vehicle at a first time, the occupant sensor data and the first scene context sensor data received from one or more sensors of the autonomous vehicle, wherein the trust model is generated by:
analyzing a real-time automation transparency to the occupant based on one or more cues provided to the occupant,
analyzing the scene complexity, and
determining workload dynamics of the occupant, based in part on a relationship between the occupant sensor data, the automation transparency and the scene complexity, to capture a dynamic interaction between occupant trust and occupant workload behavior over time;
receiving second scene context sensor data associated with an environment of the autonomous vehicle at a second time including past over trust scenarios and determining whether the scene context sensor data is the same as one of the past over trust scenarios and updating the trust model based on the same past over trust scenario as current scene context data;

determining an over trust scenario based on the trust model and a trust model threshold; and generating and implementing a human machine interface (HMI) action or a driving automation action based on the determination of the over trust scenario and the second scene context sensor data, wherein the HMI action includes one or more of an action to enable, disable, or adjust a vehicle system including one or more of an air conditioning (A/C) system, a fan system, and a seat system.

9. The computer-implemented method for adaptive trust calibration of claim 8, wherein the occupant sensor data includes one or more of occupant gaze data or occupant physiological data.

10. The computer-implemented method for adaptive trust calibration of claim 8, wherein the scene context sensor data includes one or more of operational signals for the autonomous vehicle.

11. The computer-implemented method for adaptive trust calibration of claim 8, wherein the HMI action includes one or more of displaying a display cue, providing an audio cue, or providing a haptic cue associated with a road element within the environment.

12. A system for adaptive trust calibration for an autonomous vehicle semi-autonomously or autonomously operating or driving through an environment, comprising:
a behavior controller:
receiving a trust model for an occupant of an autonomous vehicle calculated based on occupant sensor data and first scene context sensor data associated with an environment of the autonomous vehicle at a first time, including a scene complexity associated with a scene of the autonomous vehicle, the occupant sensor data and the first scene context sensor data received from one or more sensors of the autonomous vehicle in signal communication with the behavior controller, wherein the trust model is generated by:
analyzing a real-time automation transparency to the occupant based on one or more cues provided to the occupant,
analyzing the scene complexity, and
determining workload dynamics of the occupant, based in part on a relationship between the occupant sensor data, the automation transparency and the scene complexity, to capture a dynamic interaction between occupant trust and occupant workload behavior over time;
receiving second scene context sensor data associated with an environment of the autonomous vehicle at a second time including past over trust scenarios and determining whether the scene context sensor data is the same as one of the past over trust scenarios and updating the trust model based on the same past over trust scenario as current scene context data; and
determining an over trust scenario based on the trust model and a trust model threshold; and
a human machine interface (HMI) controller generating and implementing an HMI action based on the determination of the over trust scenario and the second scene context sensor data; or
a driving automation controller generating and implementing a driving automation action based on the determination of the over trust scenario and the second scene context sensor data,
wherein the HMI action includes one or more of an action to enable, disable, or adjust a vehicle system including one ore more of an air conditioning (A/C) system, a fan system, and a seat system.

13. The system for adaptive trust calibration of claim 12, wherein the occupant sensor data includes one or more of occupant gaze data or occupant physiological data.

14. The system for adaptive trust calibration of claim 12, wherein the scene context sensor data includes one or more of operational signals for the autonomous vehicle.

15. The system for adaptive trust calibration of claim 12, wherein the HMI action includes one or more of displaying a display cue, providing an audio cue, or providing a haptic cue associated with a road element within the environment.

16. The system for adaptive trust calibration of claim 12, wherein the driving automation action includes one or more of adjusting acceleration or deceleration, minimum distance boundary to a road element, or a stopping distance from a point or line in the environment.

* * * * *

UNITED STATES PATENT AND TRADEMARK OFFICE
CERTIFICATE OF CORRECTION

PATENT NO. : 12,227,202 B2
APPLICATION NO. : 17/344119
DATED : February 18, 2025
INVENTOR(S) : Kumar Akash and Teruhisa Misu Page 1 of 1

It is certified that error appears in the above-identified patent and that said Letters Patent is hereby corrected as shown below:

In the Claims

1. Column 15, Line 50 in Claim 1: reads "from the sensors, including a scene complexity asso-" should read: "from the one or more sensors, including a scene complexity asso-".

2. Column 16, Line 9 in Claim 1: reads "the determination of the over trust scenario and e" should read: "the determination of the over trust scenario and the".

Signed and Sealed this
Twentieth Day of May, 2025

Coke Morgan Stewart
*Acting Director of the United States Patent and Trademark Office*